United States Patent
Tran

(10) Patent No.: US 7,518,184 B2
(45) Date of Patent: Apr. 14, 2009

(54) DRAM ACCESS TRANSISTOR

(75) Inventor: Luan C. Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 180 days.

(21) Appl. No.: 11/474,362

(22) Filed: Jun. 26, 2006

(65) Prior Publication Data

US 2006/0240634 A1 Oct. 26, 2006

Related U.S. Application Data

(60) Continuation of application No. 10/962,665, filed on Oct. 13, 2004, now Pat. No. 7,205,606, which is a division of application No. 10/663,710, filed on Sep. 17, 2003, now Pat. No. 6,844,591.

(51) Int. Cl.
*H01L 29/76* (2006.01)
(52) U.S. Cl. ............... 257/330; 257/332; 257/E29.26; 257/327; 438/259; 438/270; 438/271; 438/589
(58) Field of Classification Search .............. 257/330, 257/E29.26
See application file for complete search history.

(56) References Cited

U.S. PATENT DOCUMENTS

| | | | |
|---|---|---|---|
| 5,013,680 A | 5/1991 | Lowrey et al. | |
| 5,122,848 A | 6/1992 | Lee et al. | |
| 5,268,587 A | 12/1993 | Murata et al. | |
| 5,362,665 A | 11/1994 | Lu | |
| 5,396,093 A | * 3/1995 | Lu ........................ | 257/306 |
| 5,540,812 A | 7/1996 | Kadomura | |
| 5,814,545 A | 9/1998 | Seddon et al. | |
| 5,909,618 A | 6/1999 | Forbes et al. | |
| 5,949,700 A | 9/1999 | Furukawa et al. | |
| 5,963,469 A | 10/1999 | Forbes | |
| 5,977,579 A | 11/1999 | Noble | |

(Continued)

FOREIGN PATENT DOCUMENTS

EP 1 326 280 A1 7/2003

(Continued)

OTHER PUBLICATIONS

PCT/2004/030367, Feb. 10, 2005, Search Report.

(Continued)

*Primary Examiner*—Tu-Tu V Ho
(74) *Attorney, Agent, or Firm*—Wells St. John P.S.

(57) ABSTRACT

Self-aligned recessed gate structures and method of formation are disclosed. Field oxide areas for isolation are first formed in a semiconductor substrate. A plurality of columns are defined in an insulating layer formed over the semiconductor substrate subsequent to which a thin sacrificial oxide layer is formed over exposed regions of the semiconductor substrate but not over the field oxide areas. A dielectric material is then provided on sidewalls of each column and over portions of the sacrificial oxide layer and of the field oxide areas. A first etch is conducted to form a first set of trenches within the semiconductor substrate and a plurality of recesses within the field oxide areas. A second etch is conducted to remove dielectric residue remaining on the sidewalls of the columns and to form a second set of trenches. Polysilicon is then deposited within the second set of trenches and within the recesses to form recessed conductive gates.

22 Claims, 16 Drawing Sheets

U.S. PATENT DOCUMENTS

| | | | |
|---|---|---|---|
| 5,998,288 A | 12/1999 | Gardner et al. | |
| 6,037,194 A | 3/2000 | Bronner et al. | |
| 6,037,263 A | 3/2000 | Chang | |
| 6,072,209 A | 6/2000 | Noble et al. | |
| 6,093,947 A | 7/2000 | Hanafi et al. | |
| 6,127,241 A | 10/2000 | Rha | |
| 6,140,171 A * | 10/2000 | Allen et al. | 438/230 |
| 6,150,687 A | 11/2000 | Noble et al. | |
| 6,151,248 A | 11/2000 | Harari et al. | |
| 6,188,100 B1 | 2/2001 | Hermes | |
| 6,191,470 B1 | 2/2001 | Forbes et al. | |
| 6,229,194 B1 | 5/2001 | Lizotte | |
| 6,340,614 B1 | 1/2002 | Tseng | |
| 6,489,204 B1 | 12/2002 | Tsui | |
| 6,498,062 B2 | 12/2002 | Durcan et al. | |
| 6,617,213 B2 | 9/2003 | Hummler | |
| 6,635,534 B2 | 10/2003 | Madison | |
| 6,696,746 B1 | 2/2004 | Farrar et al. | |
| 6,717,210 B2 | 4/2004 | Takano et al. | |
| 6,806,195 B1 | 10/2004 | Enomoto et al. | |
| 6,844,591 B1 | 1/2005 | Tran | |
| 7,071,043 B2 | 7/2006 | Tang et al. | |
| 7,122,425 B2 | 10/2006 | Chance et al. | |
| 7,214,621 B2 | 5/2007 | Nejad et al. | |
| 7,244,659 B2 | 7/2007 | Tang et al. | |
| 7,262,089 B2 | 8/2007 | Abbott et al. | |
| 7,282,401 B2 | 10/2007 | Juengling | |
| 7,285,812 B2 | 10/2007 | Tang et al. | |
| 7,349,232 B2 | 3/2008 | Wang et al. | |
| 7,384,849 B2 | 6/2008 | Parekh et al. | |
| 2001/0014533 A1 | 8/2001 | Sun | |
| 2001/0025973 A1 | 10/2001 | Yamada et al. | |
| 2001/0033000 A1 | 10/2001 | Mistry | |
| 2001/0039091 A1* | 11/2001 | Nakagawa | 438/259 |
| 2002/0094619 A1* | 7/2002 | Mandelman et al. | 438/192 |
| 2002/0102817 A1 | 8/2002 | Chen et al. | |
| 2003/0020102 A1 | 1/2003 | Gajda | |
| 2003/0168680 A1 | 9/2003 | Hsu | |
| 2004/0000686 A1 | 1/2004 | Houston | |
| 2004/0053169 A1 | 3/2004 | Kindt | |
| 2004/0071267 A1 | 4/2004 | Jacob et al. | |
| 2004/0089892 A1 | 5/2004 | Suzuki | |
| 2005/0012131 A1* | 1/2005 | Chen et al. | 257/301 |

OTHER PUBLICATIONS

PCT/2004/030367, Feb. 10, 2005, Written Opinion.
PCT/2004/030367, Mar. 21, 2006, IPRP.

* cited by examiner

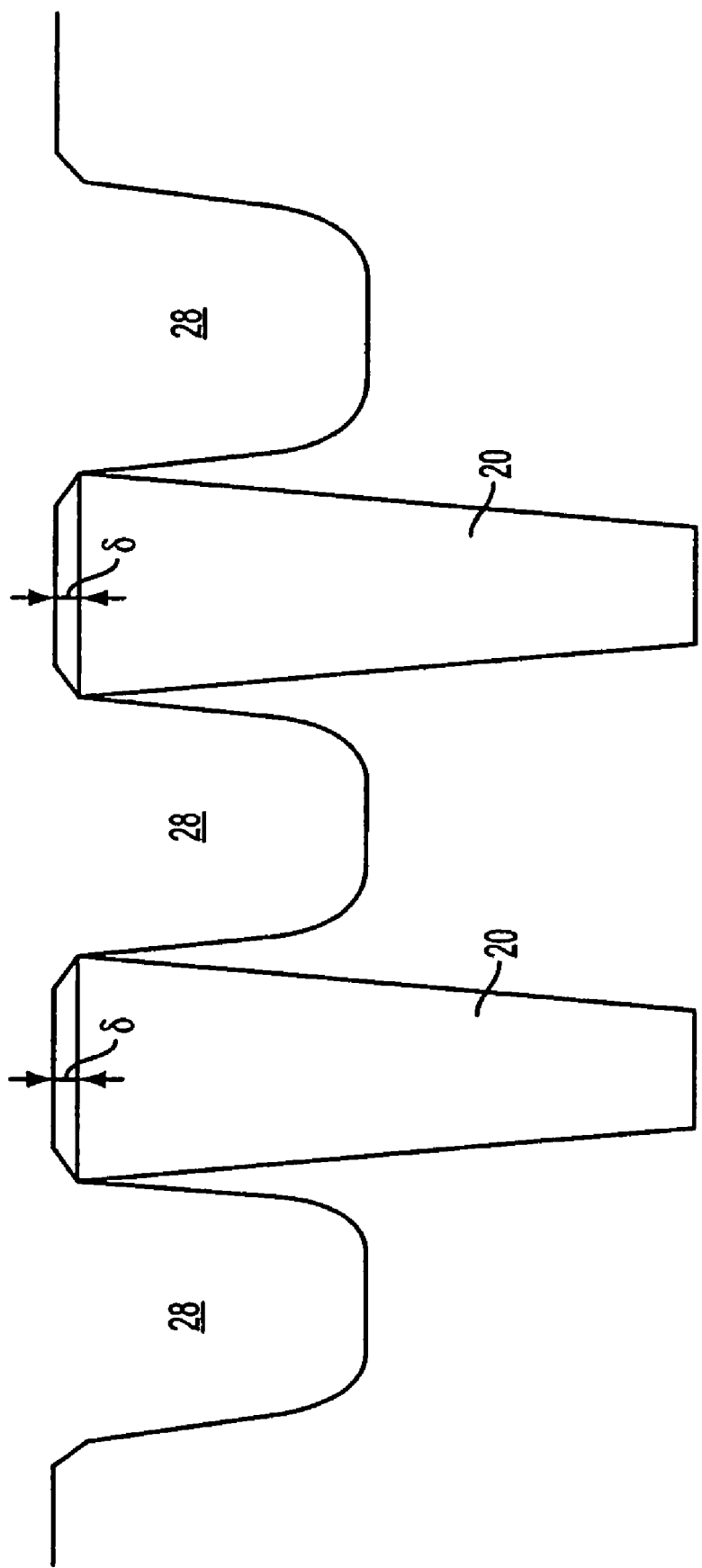

DRAM ACCESS TRANSISTOR

CROSS-REFERENCE TO RELATED APPLICATIONS

The present application is a continuation of U.S. application Ser. No.: 10/962,665, filed Oct. 13, 2004, now U.S. Pat. No. 7,205,606, which in turn was a divisional of U.S. application Ser. No. 10/663,710, filed Sep. 17, 2003, now U.S. Pat. No. 6,844,591, the disclosures of which are herewith incorporated by reference in their entirety.

FIELD OF THE INVENTION

The present invention relates to dynamic random access memory (DRAM) cells and, in particular, to a novel process for their formation.

BACKGROUND OF THE INVENTION

A dynamic random access memory cell typically comprises a charge storage capacitor (or cell capacitor) coupled to an access device, such as a Metal-Oxide-Semiconductor Field Effect Transistor (MOSFET). The MOSFET functions to apply or remove charge on the capacitor, thus affecting a logical state defined by the stored charge. The amount of charge stored on the capacitor is determined by the electrode (or storage node) area and the interelectrode spacing. The conditions of DRAM operation such as operating voltage, leakage rate and refresh rate, will generally mandate that a certain minimum charge be stored by the capacitor.

In the continuing trend to higher memory capacity, the packing of storage cells must increase, yet each must maintain required capacitance levels. This is a crucial demand of DRAM fabrication technologies. Recently, attempts to increase the packing density of cell capacitors and/or to simultaneously reduce the transistor size have been made but with limited results. For example, one approach is reducing the length of a transistor gate electrode formed atop a substrate and a source/drain region, to increase therefore the integration density. Unfortunately, reduction of the threshold voltage and/or the so-called short channel effect such as the punch-through phenomenon are likely to appear. A well-known scaling method is effective to improve the above-mentioned disadvantages. However, this approach increases the substrate doping density and requires reduction of the supply voltage, which in turn leads to reduction of the margin concerning the electric noise and fluctuations in the threshold voltage. Higher channel doping causes degradation in retention time due to high electric field at the storage node junction.

Accordingly, there is a need for an improved method of forming MOS semiconductor devices, which permits achieving an increased integration of semiconductor circuitry as well as preventing the occurrence of the short-channel effect without adding more dopants into the channel.

SUMMARY OF THE INVENTION

An embodiment of the present invention provides a method of forming memory devices, such as DRAM access transistors, having self-aligned recessed gate structures. A plurality of insulating columns are defined in an insulating layer formed over the semiconductor substrate subsequent to which a thin sacrificial oxide layer is formed over exposed regions of the semiconductor substrate. A dielectric material is then provided on sidewalls of each column and over portions of the sacrificial oxide layer. A first etch is conducted to form a first set of trenches of a first width within the semiconductor substrate. As a result of the first etch, the thin sacrificial oxide layer is completely removed, but the dielectric material is only partially removed forming dielectric residue on the sidewalls of the columns. A second etch is conducted to remove the dielectric residue remaining on the sidewalls of the columns and to form a second set of trenches of a second width which is greater than the first width of the first set of trenches.

Another embodiment of the present invention provides a self-aligned recessed gate structure for DRAM access transistors. The self-aligned recessed gate structure comprises a first recessed gate region located below a surface of a semiconductor substrate and having a width of about 35 nm to about 75 nm, more preferably of about 60 nm. The self-aligned recessed gate structure also comprises a second gate region extending above the surface of said semiconductor substrate by about 20 nm to about 800 nm. The second gate region has a width of about 50 nm to about 100 nm, more preferably of about 80 nm. Insulating spacers are located on sidewalls of the second gate region but not on sidewalls of the first recessed gate region.

These and other advantages and features of the present invention will be more apparent from the detailed description and the accompanying drawings, which illustrate exemplary embodiments of the invention.

BRIEF DESCRIPTION OF THE DRAWINGS

FIG. 5a illustrates a cross-sectional view of the FIG. 5 device taken along line 5-5'.

DETAILED DESCRIPTION OF THE INVENTION

In the following detailed description, reference is made to various specific exemplary embodiments in which the invention may be practiced. These embodiments are described with sufficient detail to enable those skilled in the art to practice the invention, and it is to be understood that other embodiments may be employed, and that structural, logical, and electrical changes may be made.

The terms "wafer" or "substrate" used in the following description may include any semiconductor-based structure that has a semiconductor surface. Wafer and structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide.

Figure 1:
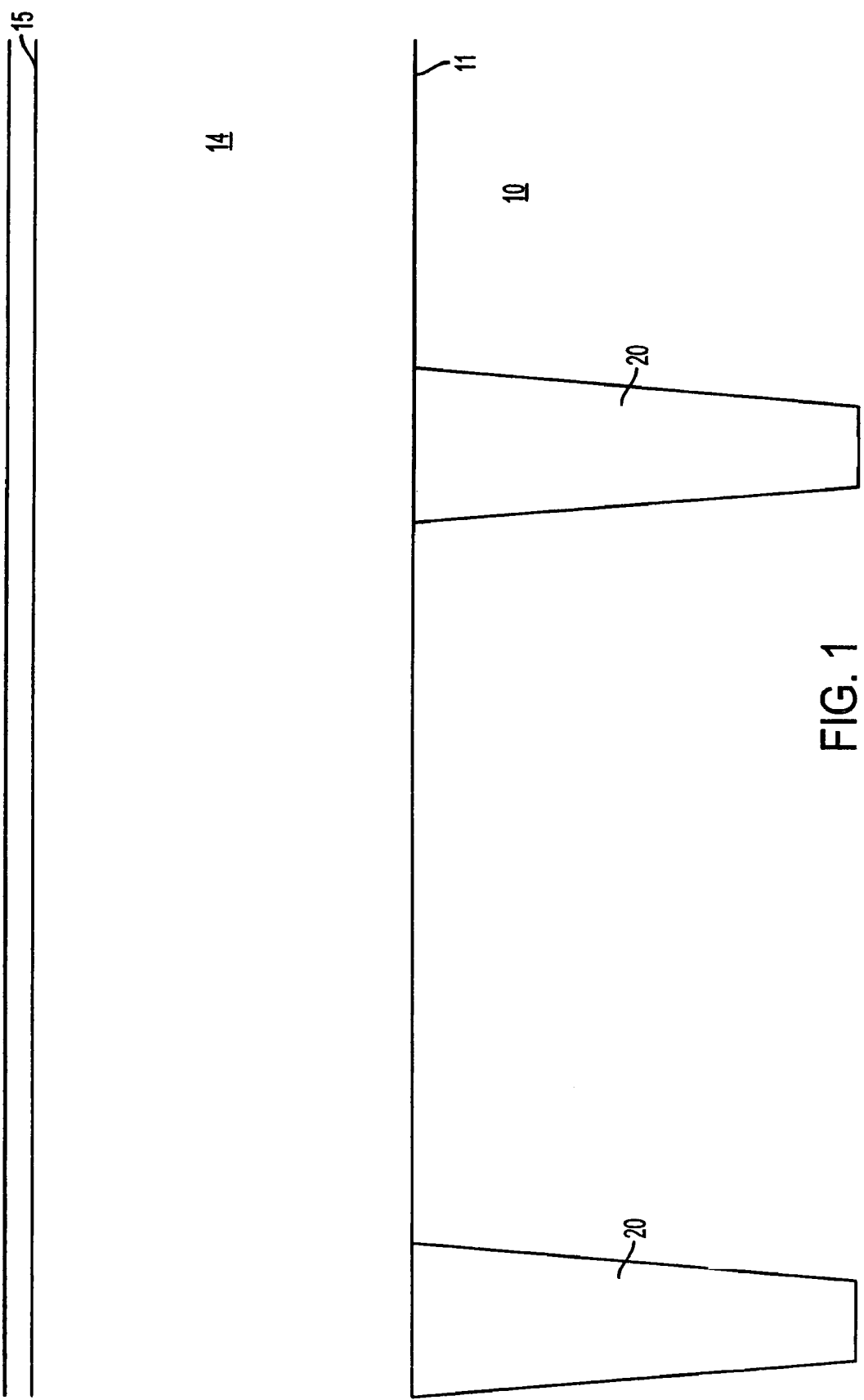
FIG. 1 illustrates a schematic cross-sectional view of a portion of a semiconductor device on which a DRAM access transistor will be formed according to a method of the present invention.

Referring now to the drawings, where like elements are designated by like reference numerals, FIGS. 1-13 illustrate a method of forming a DRAM memory device 100 (FIG. 13) having access transistors formed according to exemplary embodiments of the present invention. FIG. 1 illustrates a semiconductor substrate 10 within which shallow trenches isolation (STI) regions 20 have been formed by conventional methods. In one exemplary embodiment, to obtain the shallow trenches isolation regions 20, the substrate 10 is first etched to a depth of about 100 nm to about 1,000 nm, preferably of about 300 nm. Subsequent to the formation of the shallow trenches, the trenches are filled with an isolation dielectric, for example, a high density plasma (HDP) oxide, a material which has a high ability to effectively fill narrow trenches. Alternatively, an insulating layer formed of an oxide or of silicon nitride, for example, may be formed on the trench sidewalls, prior to filling the trenches with the isolation dielectric, to aid in smoothing out the corners in the bottom of the trenches and to reduce the amount of stress in the dielectric used to later fill in the trenches.

FIG. 1 also illustrates an insulating layer 14 formed over the semiconductor substrate 10 according to conventional semiconductor processing techniques. Insulating layer 14 may comprise a silicon oxide such as a TEOS oxide or a nitride such as silicon nitride ($Si_3N_4$), for example. The insulating layer 14 is formed over the substrate 10 to a thickness of about 10 nm to about 1,000 nm, more preferably of about 200 nm. Although reference to the insulating layer 14 will be made in this application as to the TEOS oxide layer 14, it must be understood that the insulating layer 14 may be also formed of silicon nitride, for example, or other insulating materials, and thus the invention is not limited to the use of TEOS oxide. The TEOS oxide layer 14 may be formed by known deposition processes such as chemical vapor deposition (CVD) or low temperature deposition by electron cyclotron resonance plasma enhanced CVD, among others.

Figure 2:
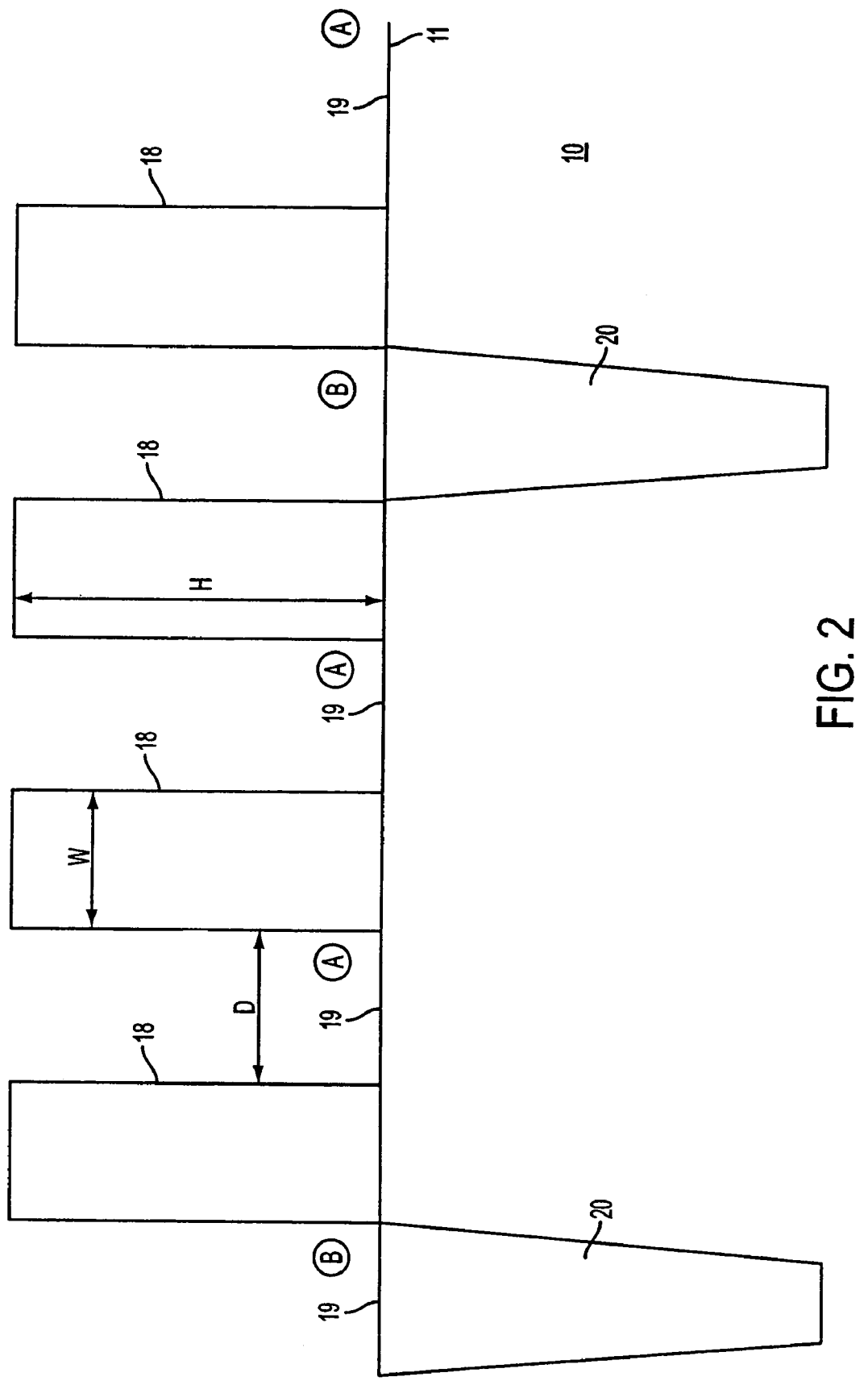
FIG. 2 illustrates a cross-sectional view of the FIG. 1 device at a stage of processing subsequent to that shown in FIG. 1.

Next, the TEOS oxide layer 14 is patterned using a photoresist layer 15 (FIG. 1) formed over the TEOS oxide layer 14 to a thickness of about 100 nm to about 1,000 nm. The photoresist layer 15 is patterned with a mask (not shown) and the TEOS oxide layer 14 is anisotropically etched through the patterned photoresist to obtain a plurality of TEOS oxide columns 18 or lines (FIG. 2) having a width W of about 50 nm to about 100 nm, more preferably of about 80 nm, and a height H of about 20 nm to about 800 nm, more preferably of about 200 nm. As shown in FIG. 2, the TEOS oxide columns 18 are spaced apart from each other by a distance D (illustratively about equal to the width W) of about 50 nm to about 100 nm, more preferably of about 80 nm. As described in more detail below, the distance D represents the width of the portions of the self-aligned recessed gate structures located above the surface of the substrate 10 and formed according to embodiments of the present invention. The TEOS oxide columns 18 also define regions A adjacent and above surface 11 of the semiconductor substrate 10 and regions B adjacent and above the dielectric material of the STI regions 20, as shown in FIG. 2.

The photoresist layer 15 is removed by conventional techniques, such as oxygen plasma, for example, or by flooding the substrate 10 with UV irradiation to degrade the photoresist and obtain the structure of FIG. 2.

Figure 3:
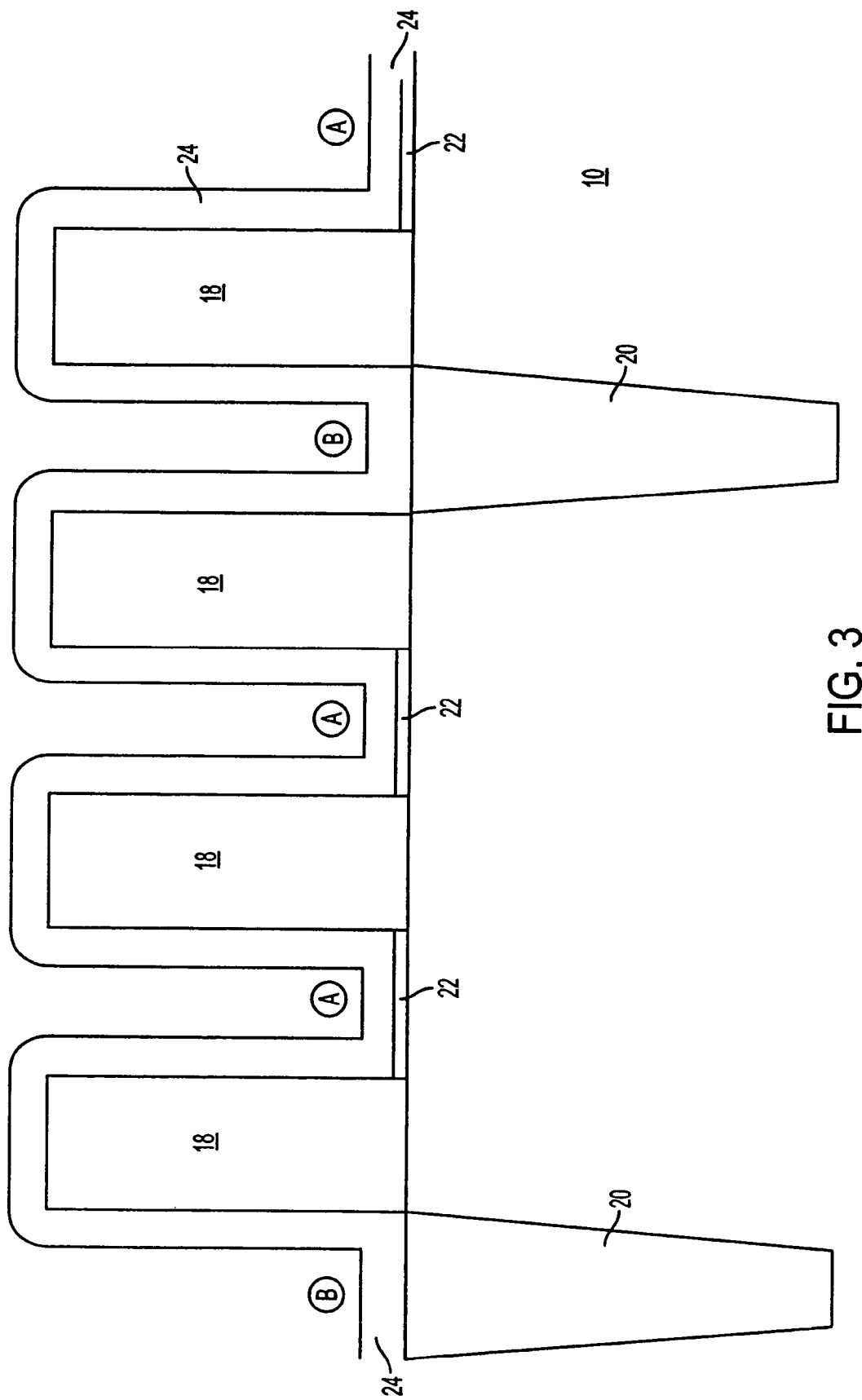
FIG. 3 illustrates a cross-sectional view of the FIG. 1 device at a stage of processing subsequent to that shown in FIG. 2.

Reference is now made to FIG. 3. Subsequent to the formation of the TEOS oxide columns 18, a thin sacrificial oxide layer 22 with a thickness of about 3 nm to about 20 nm, more preferably of about 5 nm, is thermally grown over exposed surfaces 19 (FIG. 2) of the semiconductor substrate 10 corresponding to regions A but not corresponding to regions B, as illustrated in FIG. 3. Since regions B are located over the field isolation oxide in regions 20, the oxide grown in the regions B is undetectable. As described in more detail below, the sacrificial oxide layer 22 will be employed as an etch stop layer during a poly spacer etch. Subsequent to the formation of the sacrificial oxide layer 22, a doped or undoped polysilicon layer 24 is formed over the TEOS oxide columns 18, the thin sacrificial oxide layer 22 and the dielectric material of the STI regions 20, as shown in FIG. 3. The polysilicon layer 24 is formed to a thickness of about ¼ to ⅓ of the width W or distance D (FIG. 2), by a deposition technique, for example CVD or LPCVD procedures, at a temperature of about 300° C. to about 600° C.

Figure 4:
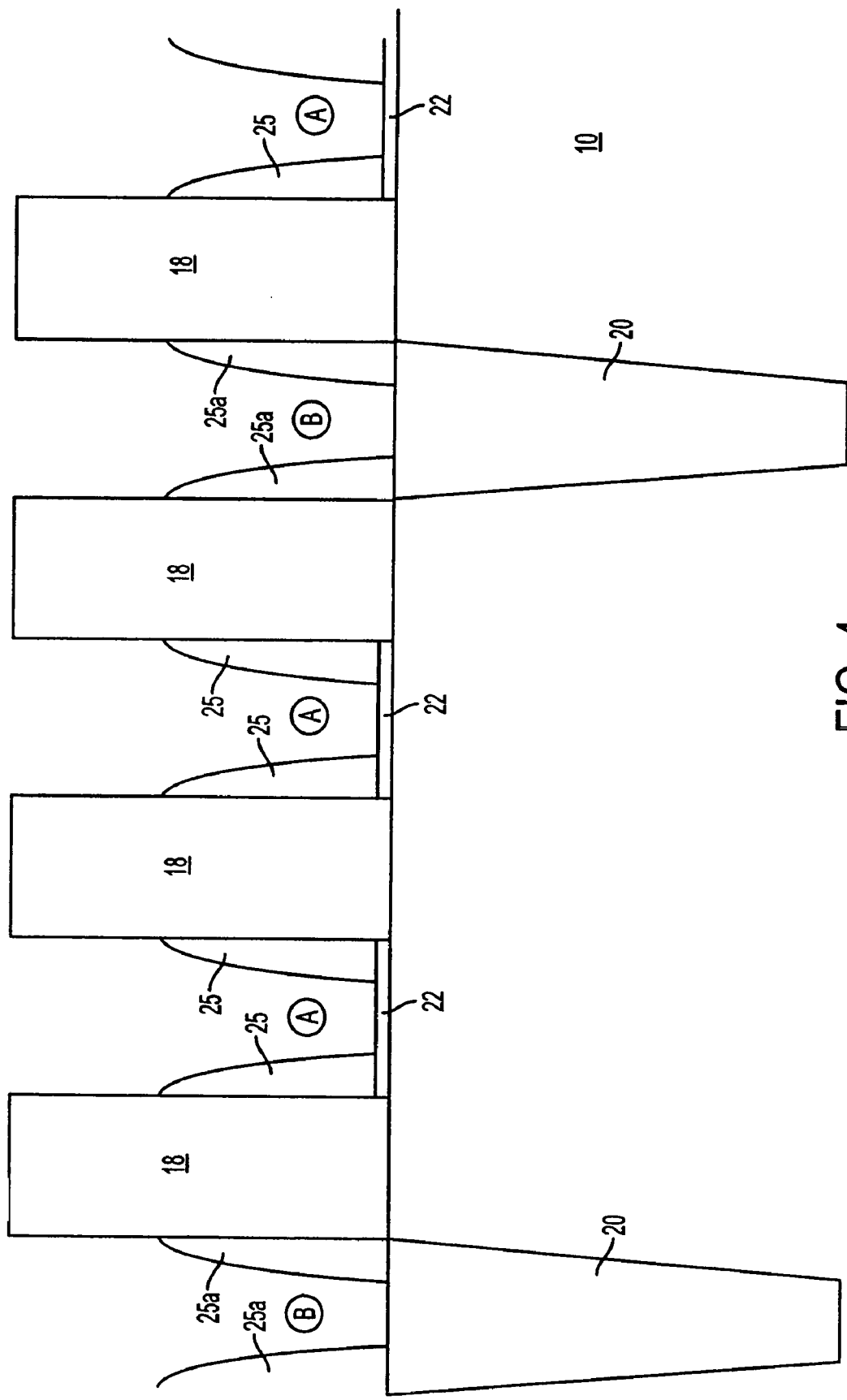
FIG. 4 illustrates a cross-sectional view of the FIG. 1 device at a stage of processing subsequent to that shown in FIG. 3.

The polysilicon layer 24 formed over the TEOS oxide columns 18, over the thin sacrificial oxide layer 22 and over the dielectric material of the STI regions 20 is then partially etched with a first etchant, such as a selective etchant with HBr based chemistry, for example, that stops on the sacrificial oxide layer 22 and on the dielectric material of the STI regions 20 and forms polysilicon spacers 25, 25a, as shown in FIG. 4. The height of the polysilicon spacers 25, 25a is adjustable by overetching, depending on the desired depth of the recessed gate. For example, in one particular embodiment, the height of the polysilicon spacers 25, 25a is of about 50 nm to about 500 nm, more preferably of about 100 nm.

Figure 5:
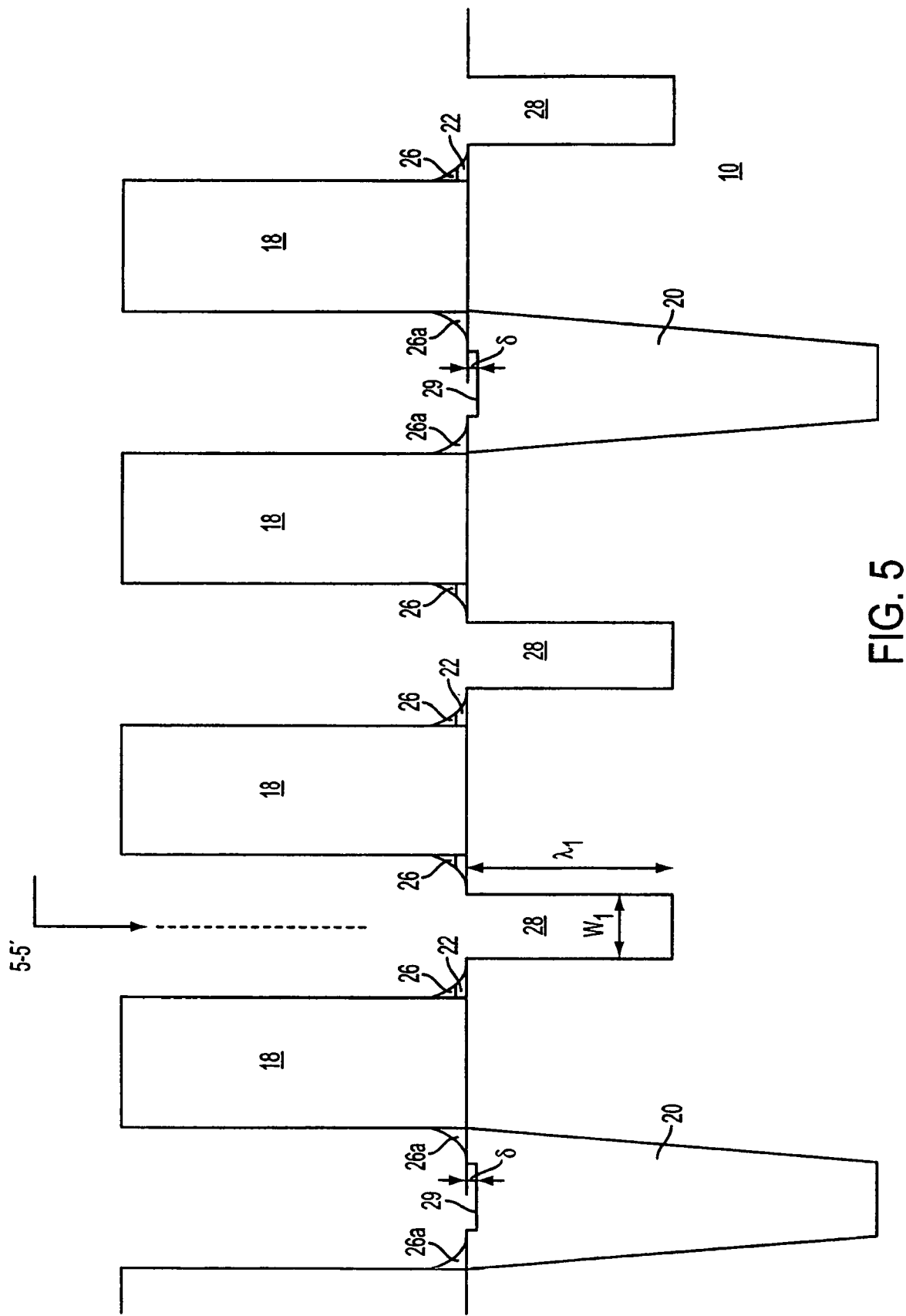
FIG. 5 illustrates a cross-sectional view of the FIG. 1 device at a stage of processing subsequent to that shown in FIG. 4.

Subsequent to the formation of the polysilicon spacers 25, 25a of FIG. 4, the semiconductor substrate 10 is etched by a directional etching process with a second etchant having a high selectivity to oxide in a HBr ambient, for example, to a depth $\lambda_1$ (FIG. 5) of about 100 nm to about 500 nm, more preferably of about 100 nm to about 150 nm, to obtain first transistor trenches or grooves 28 (FIGS. 5; 5a) where a first set of recessed self-aligned gate structures of the DRAM memory device 100 (FIG. 12) will be later formed as it will be described in detail below. At the end of the formation of the first transistor trenches 28, the polysilicon spacers 25 are almost totally consumed, with polysilicon residues 26 remaining adjacent the first transistor trenches 28, as shown in FIG. 5. The sacrificial oxide layer 22 under spacers 25 is not consumed to protect the silicon surface from pitting caused by the silicon-etch process. The first transistor grooves 28 are formed to a width $W_1$ (FIG. 5) which is about ½ of the distance D of FIG. 2.

During the selective etch for the formation of the first transistor trenches 28, the dielectric material of the STI regions 20 is also etched to a depth δ (FIG. 5) of about 1 nm to about 10 nm, more preferably of about 5 nm. This etching of the dielectric material depends on etch selectivity of polysilicon etch with respect to oxide. The selective etching produces polysilicon residues 26a (the same as residues 26) and STI recesses 29 (FIG. 5) where a second set of recessed self-aligned gate structures of the DRAM memory device 100 (FIG. 12) will be later formed as it will be described in detail below.

Figure 6:
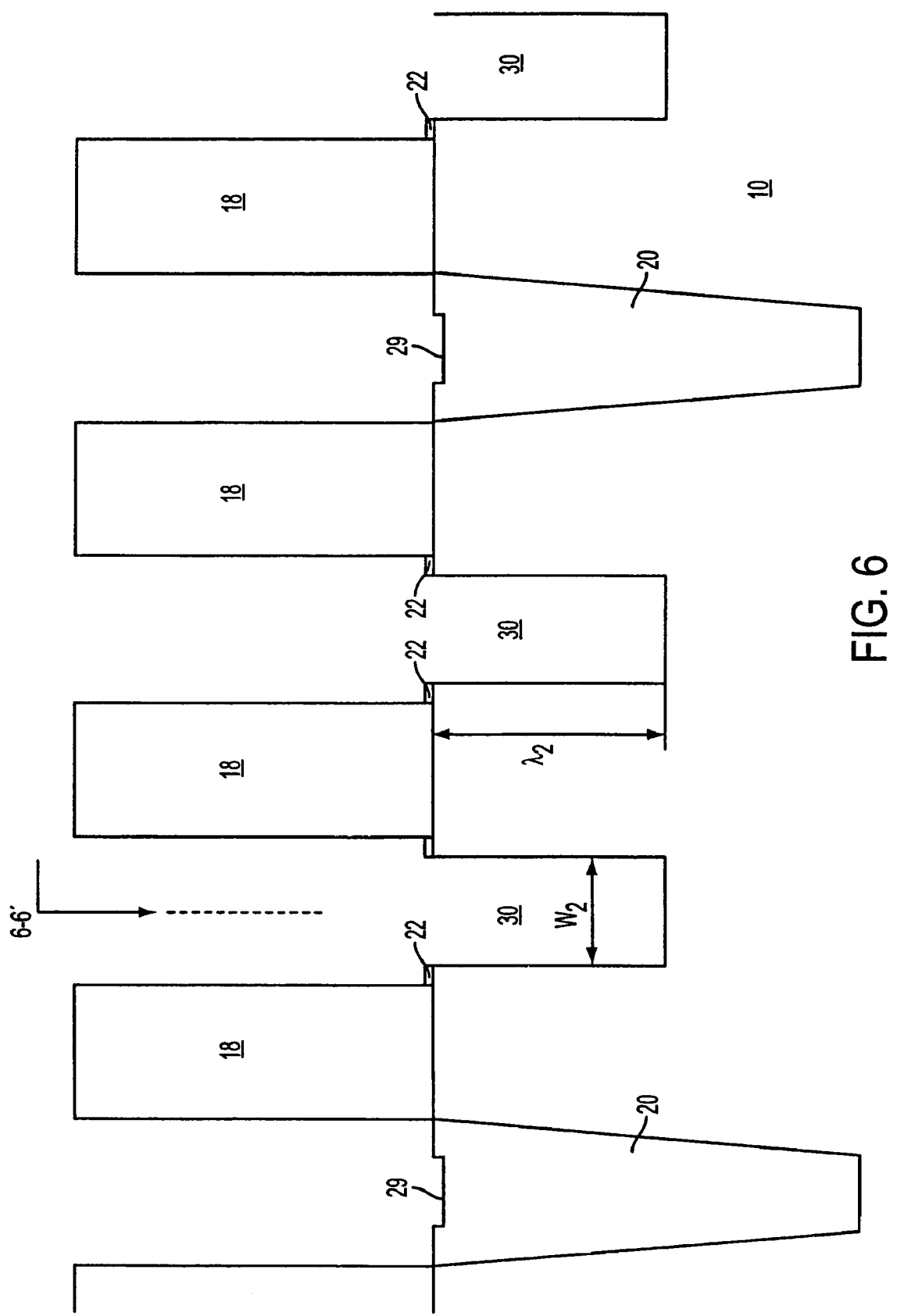
FIG. 6 illustrates a cross-sectional view of the FIG. 1 device at a stage of processing subsequent to that shown in FIG. 5.
Figure 6A:
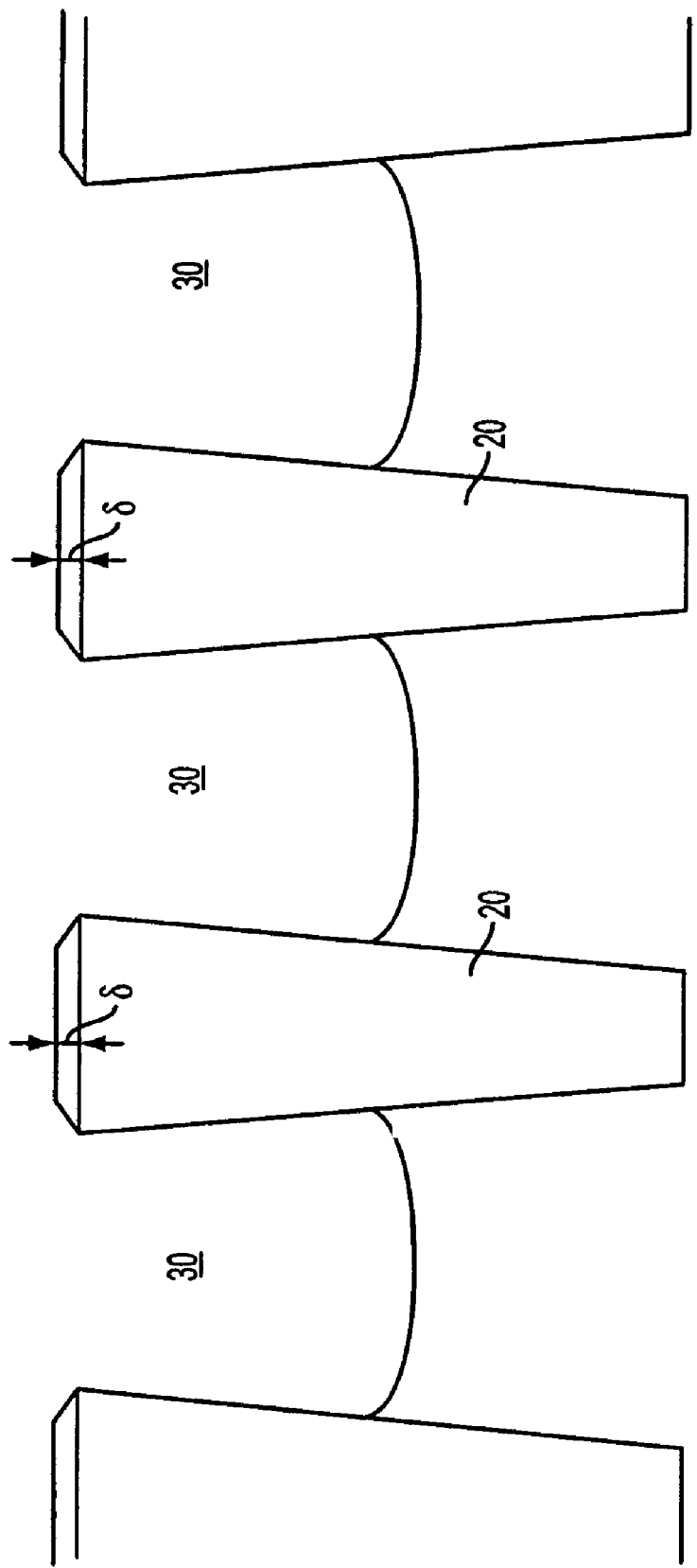
FIG. 6a illustrates a cross-sectional view of the FIG. 6 device taken along line 6-6'.

Subsequent to the formation of the first transistor trenches 28 (FIGS. 5; 5a) and of the STI recesses 29 (FIG. 5), a third etch, for example an isotropic etch or a wet etch such as a TMAH etch, is next conducted to remove polysilicon residues 26, 26a remaining adjacent the first transistor trenches 28 and the STI recesses 29, respectively, and to obtain the structure of FIG. 6. As a result of the isotropic or wet etch, second transistor trenches or grooves 30 (FIGS. 6; 6a) are also formed to a width $W_2$ which is greater than the width $W_1$ of the first transistor trenches 28, that is to a width $W_2$ which is up to ¾ the distance D of FIG. 2. Second transistor grooves 30 are also formed to a depth $\lambda_2$ (FIG. 6), which is greater than the depth $\lambda_1$ of the first transistor grooves, that is to a depth $\lambda_2$ of about 200 nm to about 700 nm, more preferably of about 250 nm to about 300 nm.

An optional cleaning step of all exposed surfaces of the semiconductor substrate 10 of FIG. 6 may be conducted at this step of processing. Alternatively, another sacrificial silicon oxide layer may be grown over the exposed surfaces of the semiconductor substrate 10 of FIG. 6 and then stripped by conventional methods to ensure removal of any existent impurities, particulates and/or residue from the exposed surfaces, and to also smooth the silicon surface in the groove 30.

Figure 7:
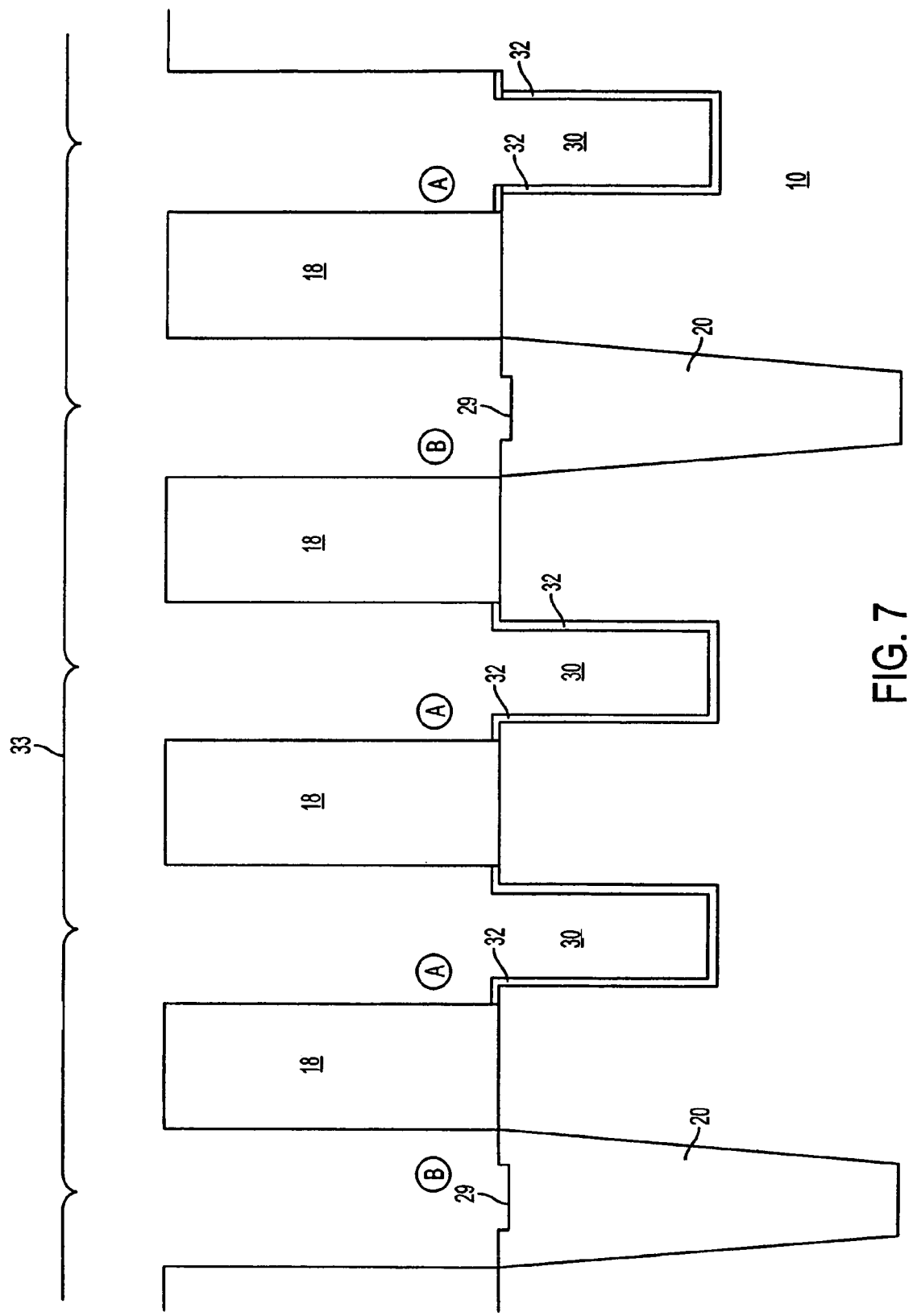
FIG. 7 illustrates a cross-sectional view of the FIG. 1 device at a stage of processing subsequent to that shown in FIG. 6.

Subsequent to the formation of the second transistor trenches 30 and to the optional cleaning step, a thin gate oxide layer 32 is selectively formed on the sidewalls and bottoms of the second transistor trenches 30 and on the adjacent exposed surfaces of the semiconductor substrate 10 corresponding to regions A but not over the recesses 29 corresponding to regions B, as shown in FIG. 7. The thin gate oxide layer 32 may be thermally grown in an oxygen ambient, at a temperature between about 600° C. to about 1,000° C. and to a thickness of about 3 nm to about 10 nm.

Figure 8:
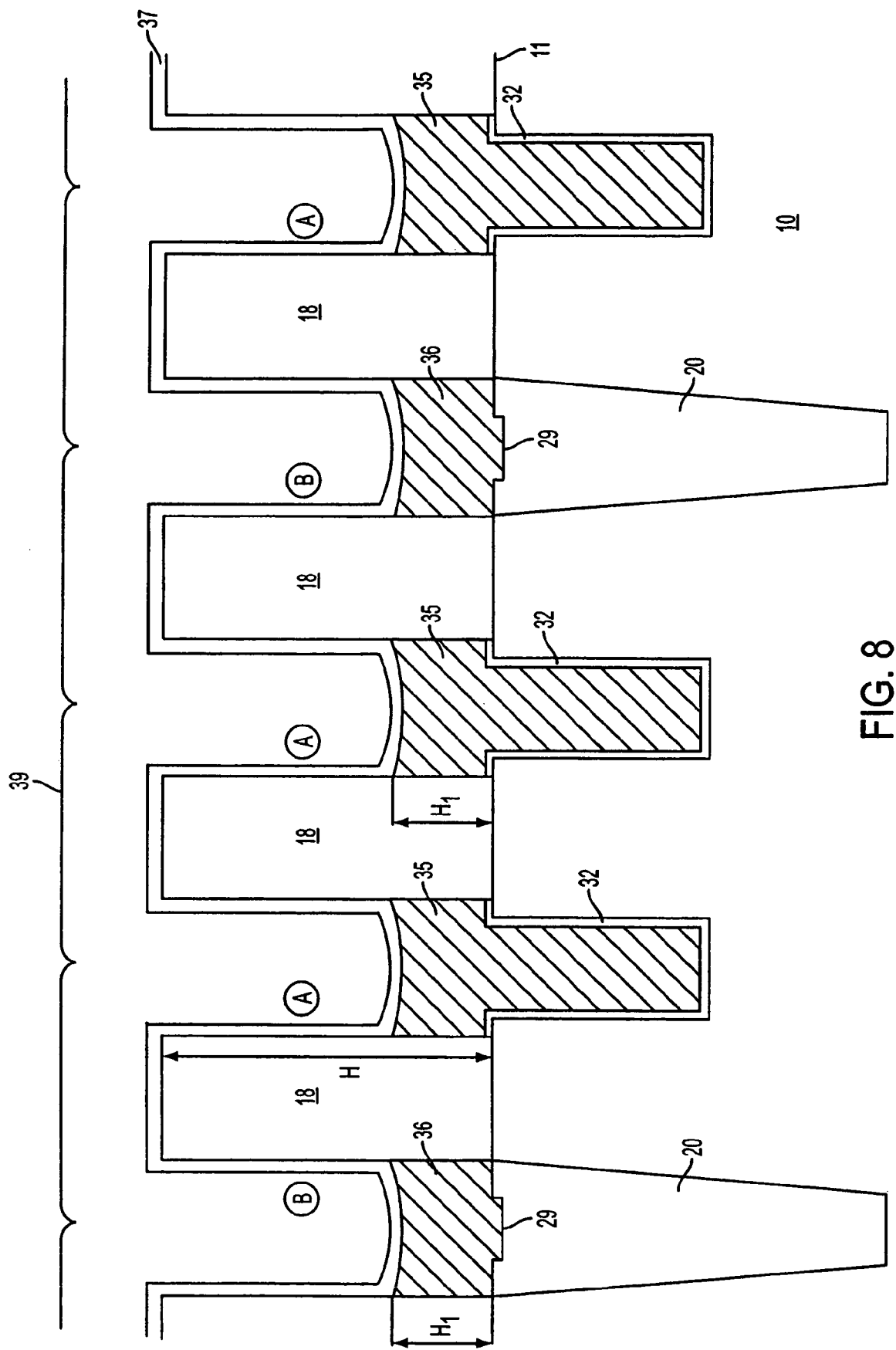
FIG. 8 illustrates a cross-sectional view of the FIG. 1 device at a stage of processing subsequent to that shown in FIG. 7.

A polysilicon material 33 (FIG. 7) is then formed within both regions A, B as well as inside the second transistor trenches 30 and the STI recesses 29 of the substrate 10. The polysilicon material 33 may be may be doped n+ or p+ and may be blanket deposited over the structure of FIG. 7, via LPCVD procedures at a temperature of about 300° C. to about 600° C., for example, to completely fill regions A and B. Once regions A and B are completely filled, the polysilicon material 33 is subjected to a mild isotropic poly etch to etch back parts of the polysilicon from regions A and B and to form polysilicon gate layers 35 corresponding to regions A and to second transistor trenches 30, and polysilicon gate layers 36 corresponding to regions B and to STI recesses 29, as shown in FIG. 8. The polysilicon gate layers 35, 36 extend above the surface 11 of the semiconductor substrate 10 by a distance $H_1$ (FIG. 8) of about 5 nm to about 100 nm, more preferably by about 25 nm. It must be noted that the height $H_1$ of the polysilicon gate layers 35, 36 must be smaller than the height H of the TEOS oxide columns 18, to allow the formation of the remaining metal-clad gate stack structures, as described in detail below.

Referring still to FIG. 8, a barrier layer 37 of about 5 nm to about 40 nm is next formed over the polysilicon gate layers 35, 36. The barrier layer 37 may be formed of tungsten nitride (WNx), titanium nitride (TiN) or titanium-rich TiN material, among others. Alternatively, the barrier layer 37 may be a transition metal boride layer such as zirconium boride (ZrBx), titanium boride (TiBx), hafnium boride (HfBx) or tantalum boride (TaBx). Such materials exhibit good adhesion characteristics to silicon and, due to the low resistivities of about 5-150 microOhms-cm of the transition metal borides, the total height of the gate stack can be decreased.

Figure 9:
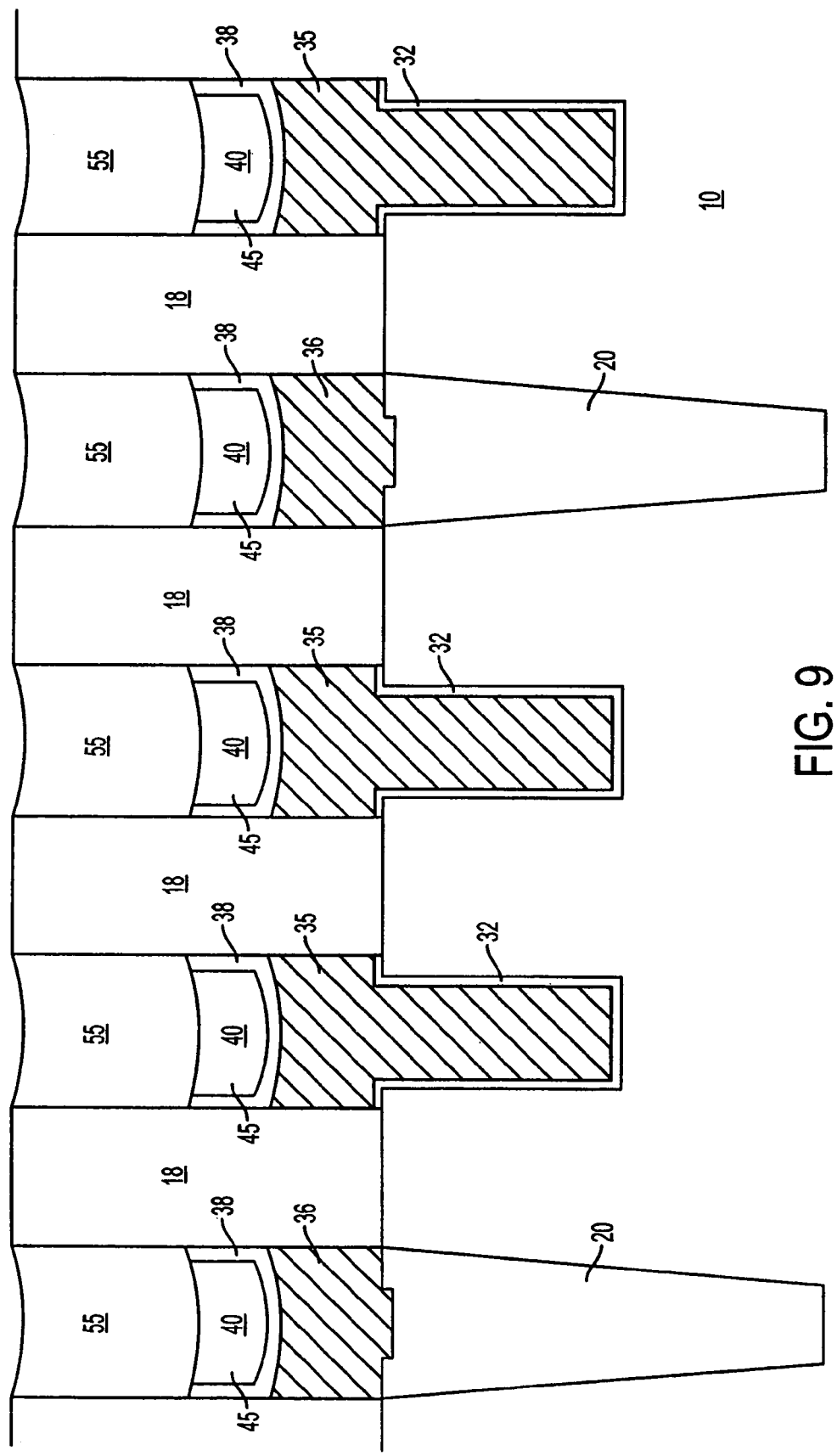
FIG. 9 illustrates a cross-sectional view of the FIG. 1 device at a stage of processing subsequent to that shown in FIG. 8.

Subsequent to the formation of the barrier layer 37, a conductive material 39 (FIG. 8) is formed, by blanket deposition for example, over the barrier layer 37 and over the TEOS oxide columns 18, to completely cover the structure of FIG. 8. The conductive material 39 and the barrier layer 37 are then subjected to a CMP process, for example, and subsequently to an etching process to remove portions of the conductive material 39 and of the barrier layer 37 from the top of the TEOS oxide columns 18 and from in between the TEOS oxide columns 18, to form highly conductive metal stacks 45, as shown in FIG. 9. Each of the highly conductive stacks of FIG. 9 includes a patterned barrier layer 38 and a conductive layer 40. The conductive layer 40 can comprise a material such as titanium (Ti) or titanium nitride (TiN), among others, or simply, it can be formed by a silicide process such as cobalt silicide (CoSi), titanium silicide (TiSi), molybdenum silicide (MoSi) or nickel silicide (NiSi), among others. As known in the art, TiSi and CoSi do not adhere well to gate dielectric materials and, as a consequence, they may lift from the gate dielectric materials; however, NiSi and MoSi are known to adhere well to gate dielectric materials and they are fully silicide when formed on an existing thin polysilicon film.

An insulating cap material of about 50 nm to about 100 nm is next deposited over substrate 10 to completely fill regions A and B of FIG. 8 and the substrate top surface is planarized so that cap regions 55 (FIG. 9) are formed over the highly conductive metal stacks 45. The cap material may be formed of silicon dielectrics such as silicon nitride or silicon oxide, but TEOS, SOG (spin on glass) or carbides may be used also. The cap material may be also formed of an etch-stop insulating material.

Although the embodiments detailed above have been described with reference to the formation of a barrier layer, such as the transition metal boride layer 37, and of the conductive layer 40 formed over the transition metal boride layer 37 to form highly conductive metal stacks 45, it must be understood that the invention is not limited to these embodiments. Accordingly, the present invention also contemplates the formation of other gate structures in lieu of the highly conductive metal stacks 45. For example, and according to another embodiment of the present invention, a thin film of a transition metal such as titanium (Ti) or titanium nitride (TiN) having a thickness of less than 30 nm can be deposited over the polysilicon gate layers 35, 36 by a PVD or CVD process. Optionally, the titanium or titanium nitride film can be further exposed to a gas containing a dopant element such as boron, for example. If boron is employed, the wafer is placed in a rapid thermal process (RTP) chamber and a flow of $B_2H_6$ or $BF_3$ gas diluted with hydrogen ($H_2$), nitrogen ($N_2$) and/or argon (Ar) gas is provided in the vicinity of the titanium or titanium nitride film to form the transition metal boride film.

In yet another embodiment, a thin film of a transition metal such as titanium (Ti) is deposited over the polysilicon gate layers 35, 36 and then the polysilicon gate layers and the transition metal film are subsequently implanted with a dopant such as boron. Accordingly, a doped polysilicon and the transition metal layer 37 can be formed by a single boron implant.

Alternatively, a layer of metal capable of forming a silicide (not shown) such as cobalt, nickel, molybdenum, titanium or tungsten, for example, may be deposited over the polysilicon gate layers 35, 36 to a thickness of about 20 nm to about 50 nm. For deposition, sputtering by RF or DC may be employed but other similar methods such as CVD may be used. Subsequent to the deposition of the metal capable of forming a silicide, substrate 10 undergoes a rapid thermal anneal (RTA), typically for about 10 to 60 seconds, using a nitrogen ambient, at about 600° C. to about 850° C. so that the metal in direct contact with the polysilicon gate layers 35, 36 is converted to its silicide. The silicide regions form conductive regions on top of the polysilicon gate layers 35, 36. Preferably, the refractory metal has low resistance and low resistivity as a silicide. However, the refractory metal silicide may comprise any refractory metal, including but not limiting to titanium, cobalt, tungsten, tantalum, molybdenum, nickel and platinum. If a silicide is employed, barrier layer 37 as described above may be also optionally employed. The barrier layer 37 may be also omitted to simplify the process steps. In any event, care must be taken later on during the processing to prevent tungsten or silicide materials from being oxidized during the source/drain oxidation.

Figure 10:
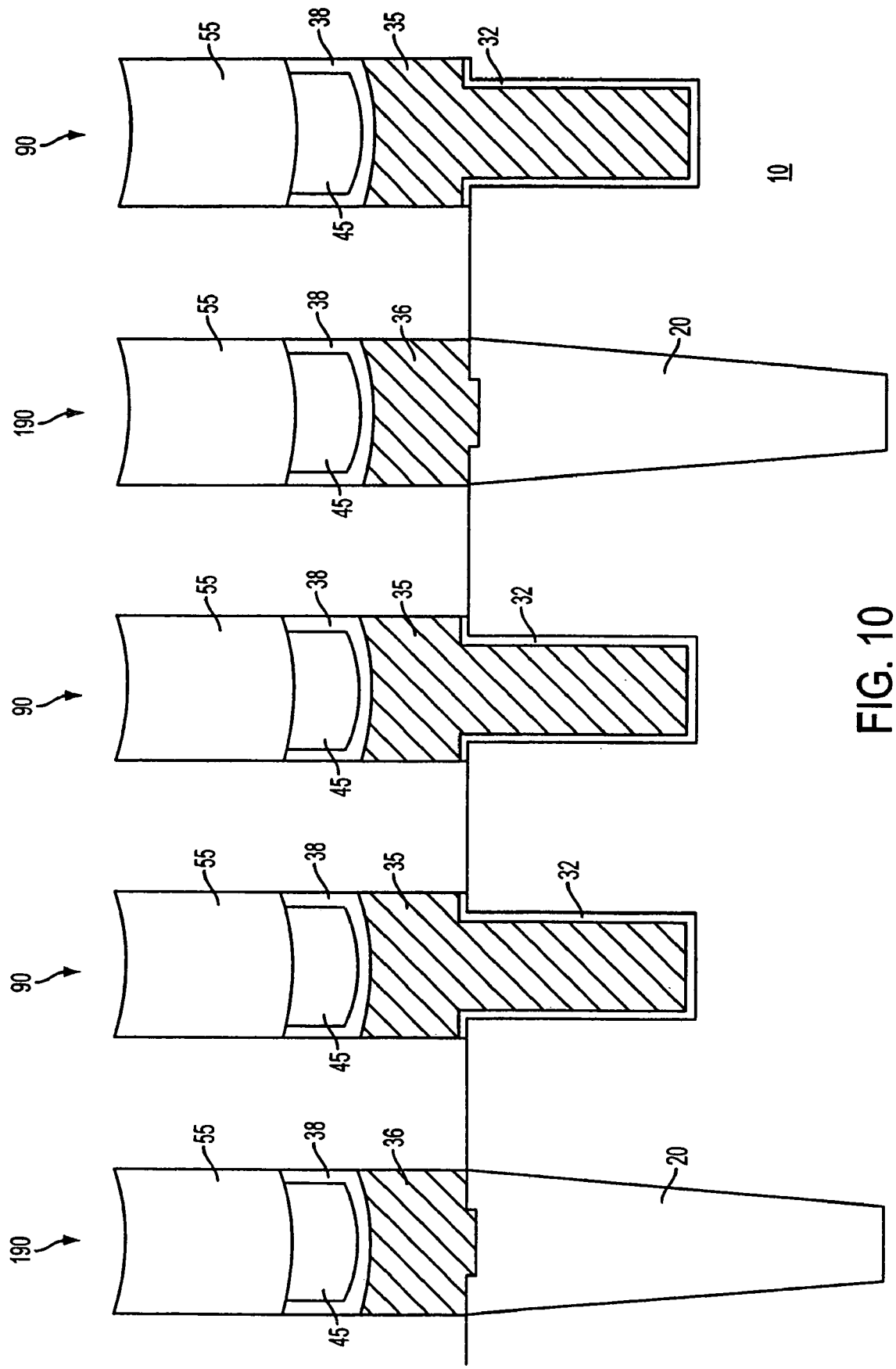
FIG. 10 illustrates a cross-sectional view of the FIG. 1 device at a stage of processing subsequent to that shown in FIG. 9.

Reference is now made to FIG. 10. Subsequent to the formation of the highly conductive metal stacks 45 and of the cap regions 55 (FIG. 9), the TEOS oxide columns 18 are removed by etching, for example, so that the formation of self-aligned recessed gate stacks 90, 190 (FIG. 10) of DRAM memory device 100 is completed. Although the following processing steps for the completion of the self-aligned recessed gate stacks 90, 190 will refer to and illustrate the highly conductive metal stacks 45 comprising conductive layer 40 formed over the patterned barrier layer 38 and polysilicon gates layers 35, 36, it must be understood that the present invention is not limited to this embodiment, and other embodiments such as the formation of gate stacks comprising a dielectric material (for example, a high-k dielectric material) formed over the polysilicon gates, for example, are also contemplated. Additionally, gate stacks comprising non-silicide materials such as TiN, WN, Ta, TaN or Nb, among others, which may be employed as direct gate materials on gate dielectrics, are also contemplated by the present invention, and it must be understood that the above-described embodiments are only exemplary and the invention is not limited to them.

At this point self-aligned recessed gate stacks 90 (FIG. 10) (each having gate oxide layer 32, polysilicon gate layer 35, highly conductive metal stack 45 and nitride cap 55) and self-aligned recessed gate stacks 190 (FIG. 10) (each having polysilicon gate layers 36, highly conductive metal stack 45 and nitride cap 55) have been formed. The self-aligned recessed gate stacks 90, 190 may now be used in a conventional implant process where the gate structures are used as masks for the dopant implantation of source and drain regions as further described below.

Figure 11:
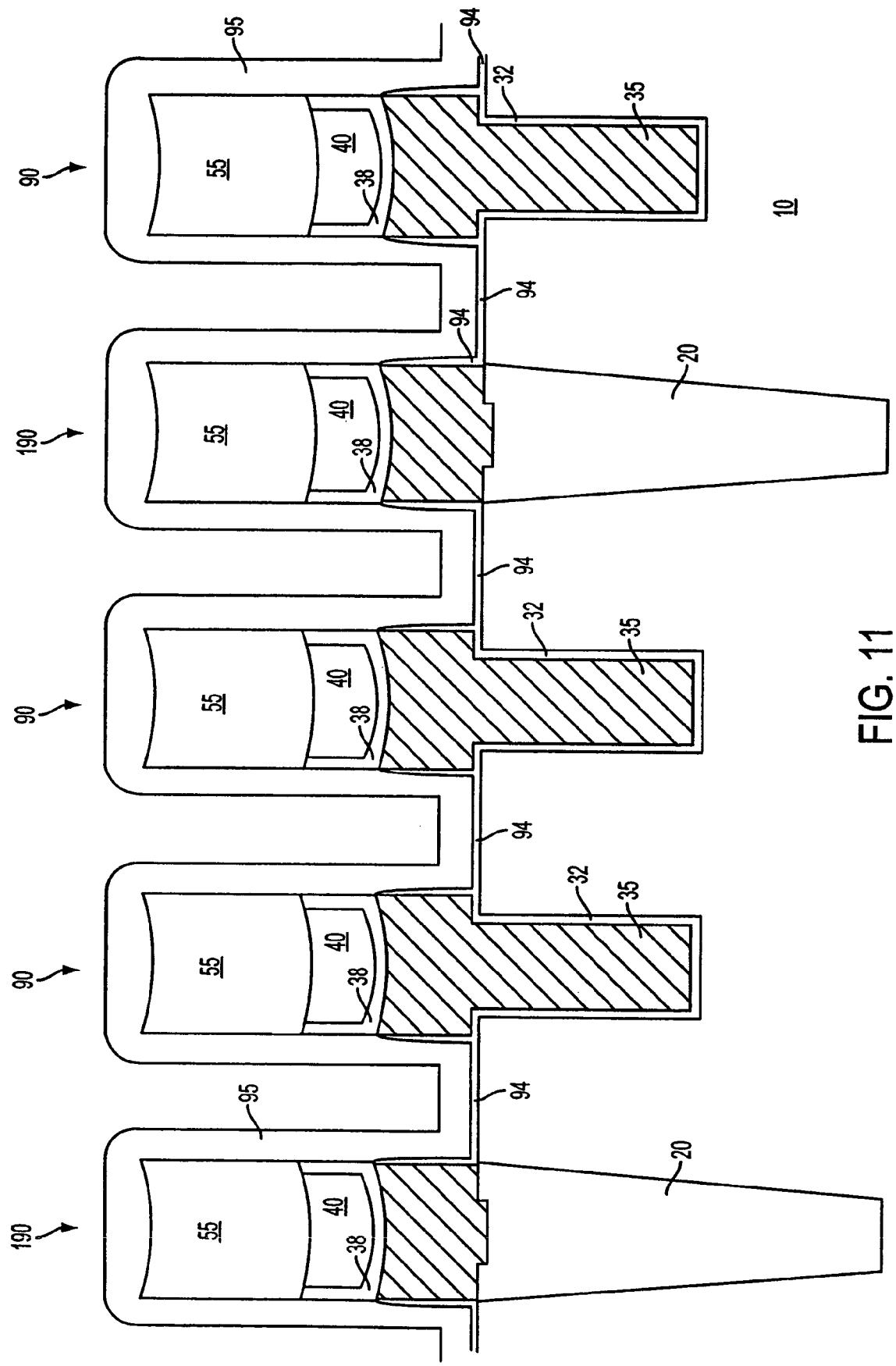
FIG. 11 illustrates a cross-sectional view of the FIG. 1 device at a stage of processing subsequent to that shown in FIG. 10.

At this point, processing steps for transistor formation proceed according to conventional semiconductor processing techniques. The next step in the flow process is the growth of a selective oxide 94 (FIG. 11) on the exposed surfaces of the semiconductor substrate 10 obtained as a result of the removal of the TEOS oxide columns 18 (FIG. 9), as well as on the polysilicon sidewalls of the gate stacks 90, 190. The selective oxide 94 may be thermally grown in an oxygen and hydrogen ambient, at a temperature between about 600° C. to about 1,000° C. and to a thickness of about 3 nm to about 8 nm. Subsequent to the formation of the selective oxide 94, a layer 95 of spacer dielectric material, such as nitride material for example, is formed over the gate stacks 90, 190 and the selective oxide 94, as shown in FIG. 11.

Figure 12:
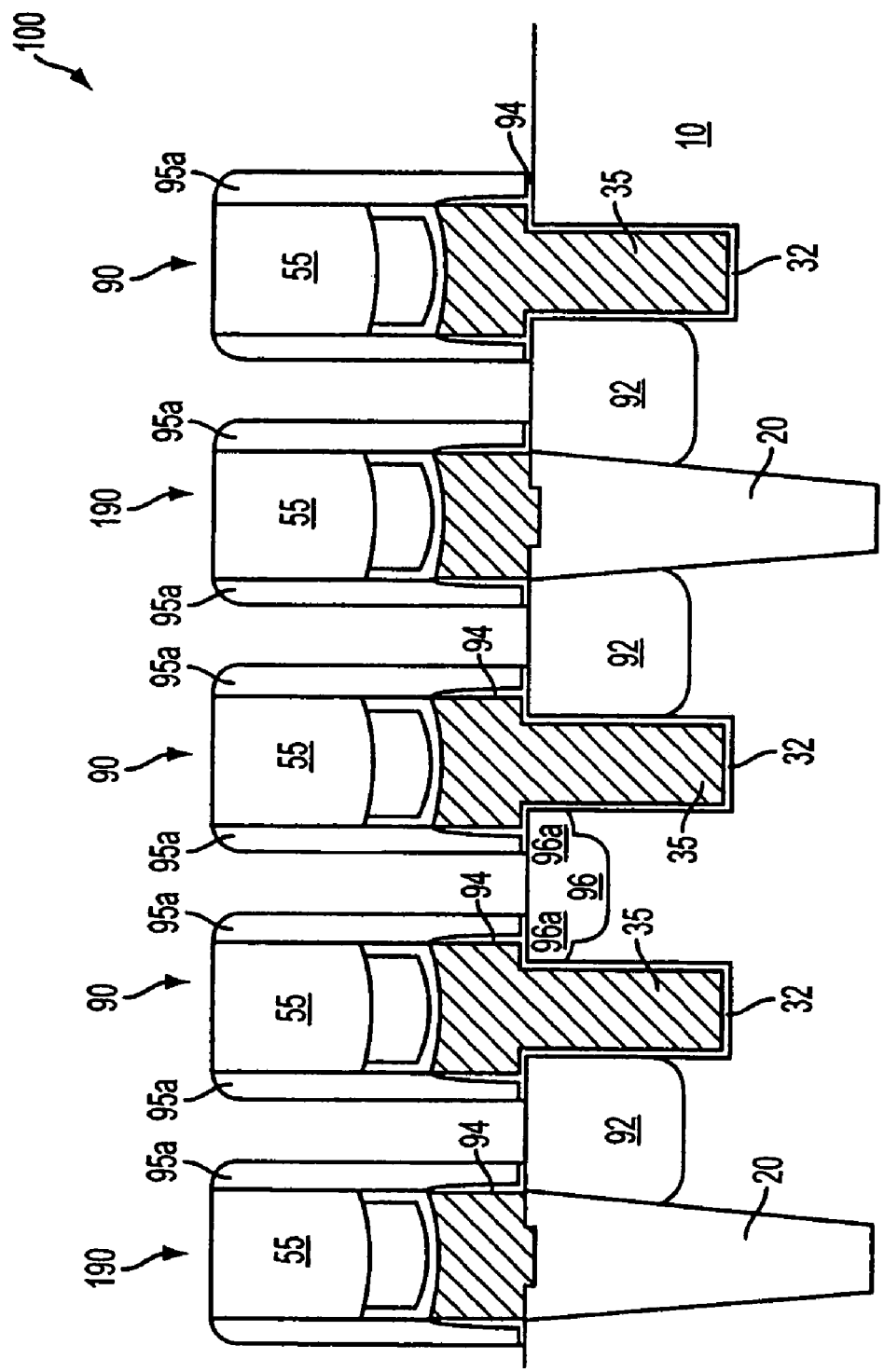
FIG. 12 illustrates a cross-sectional view of the FIG. 1 device at a stage of processing subsequent to that shown in FIG. 11.

The self-aligned recessed gate stacks 90, 190 protected by layer 95 of nitride material and by the selective oxide 94 can now undergo conventional processing steps for the formation of source and drain regions 92, 96 and of lightly doped drain (LDD) regions 96a, as shown in FIG. 12. For this, doping through layer 95 and the selective oxide 94 is conducted to form the source and drain regions 92, 96 and the lightly doped drain (LDD) regions 96a, subsequently to which layer 95 and selective oxide 94 are etched back to form nitride spacers 95a, also illustrated in FIG. 12. Alternatively, the layer 95 of nitride material and the selective oxide 94 are first etched back to form nitride spacers 95a, and then the resulting structure is subjected to doping for the formation of the source and drain regions 92, 96 and the lightly doped drain (LDD) regions 96a.

Figure 13:
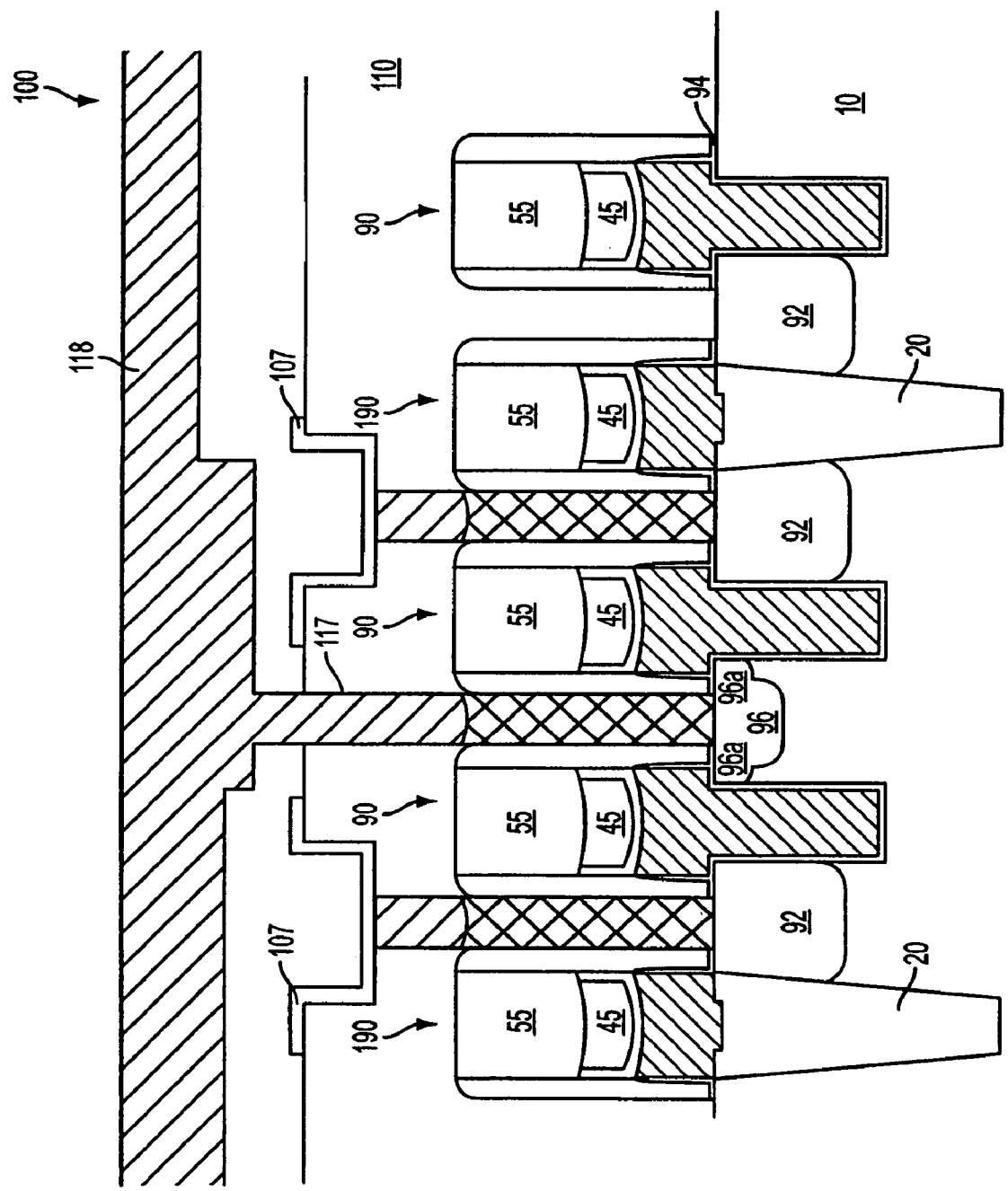
FIG. 13 illustrates a cross-sectional view of the FIG. 1 device at a stage of processing subsequent to that shown in FIG. 12.

Subsequent to the formation of the source and drain regions 92, 96 and the lightly doped drain (LDD) regions 96a of FIG. 12, contact openings for conductors 117 and/or capacitors 107 into semiconductor substrate 10 through an oxide layer 110 such as BPSG, for example, are also formed to produce a semiconductor device such as the DRAM memory device 100, all illustrated in FIG. 13. Although, for simplicity, FIG. 13 illustrates the formation of bit line 118 over the capacitor structures 107, it must be understood that this embodiment is only exemplary and the invention also contemplates the formation of a bit line under capacitor (or capacitor over bit line (COB)). In fact, an embodiment with a COB is desirable as it would decrease the length of the plug to silicon which, in turn, would decrease the parasitic capacity of the bit line.

Figure 14:
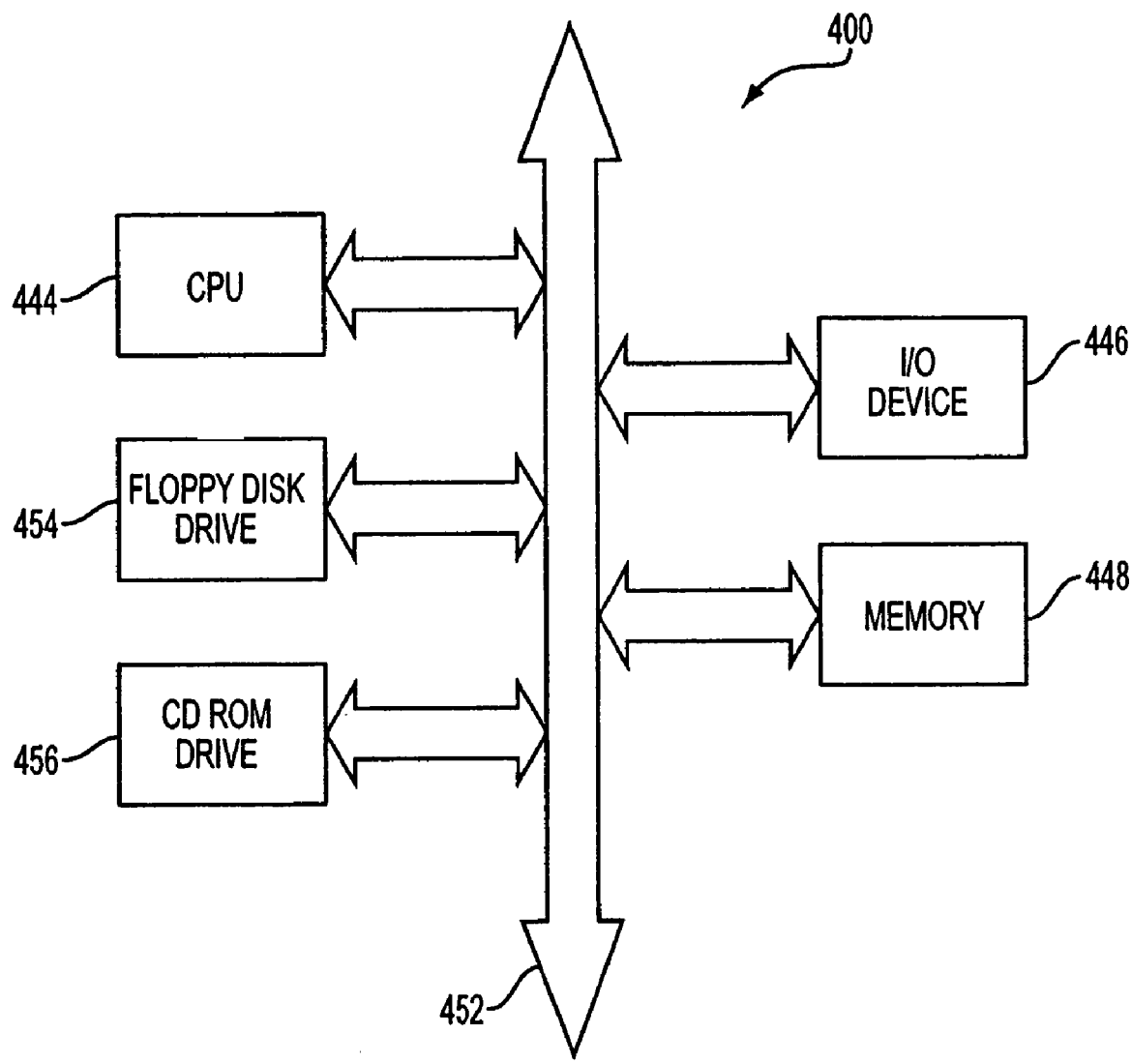
FIG. 14 is an illustration of a computer system having a DRAM access transistor formed according to a method of the present invention.

The self-aligned recessed gate stacks 90, 190 (FIGS. 10-13) and associated transistors formed in accordance with embodiments of the present invention could be used in any integrated circuit structure. In one example, they can be used in a processor-based system 400 which includes a memory circuit 448, for example the DRAM memory device 100, as illustrated in FIG. 14. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452.

Although the embodiments of the present invention have been described above with reference to the formation of self-aligned recessed gate stacks 90, 190 comprising specific materials, such as the polysilicon material for the formation of layers 35, 36 for example, it must be understood that the present invention is not limited to these specific examples. Accordingly, the present application has applicability to other gate metals or materials known in the art, or combination of such metals and materials, for the formation of the self-aligned recessed gate stacks 90, 190 of the present invention.

In addition, although the embodiments of the present invention have been described above with reference to the formation of polysilicon spacers, such as the polysilicon spacers 25, 25a, over a thin oxide layer, such as the thin sacrificial oxide layer 22, and over TEOS oxide columns, such as TEOS oxide columns 18, it must be understood that the present invention is not limited to these three specific materials. Accordingly, the present application has applicability to other materials, or combination of such materials, for the formation of the spacers, of the oxide layer and of the columns used for the formation of the self-aligned recessed gate stacks 90, 190. For example, the present invention also contemplates using a high-k dielectric material, $HfO_2$, or $Al_2O_3/ZrO_2$, among others, in addition to the conventional oxide and nitride materials. Thus, the polysilicon/oxide/TEOS oxide combination (corresponding to the polysilicon spacers/thin oxide layer/TEOS oxide columns) is only one exemplary embodiment of the present invention.

The above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A self-aligned recessed gate structure, comprising:
    a gate layer which is conductive, comprising:
        a first region having a first width, said first region being recessed below a surface of a semiconductor substrate; and
        a second region having a second width, said second region extending above said surface of said semiconductor substrate;
    a conductive layer located above and in conductive electrical connection with said second region of said gate layer;
    a barrier layer separating said conductive layer from said second region of said gate layer, the barrier layer being conductive and through which said conductive layer is in conductive electrical connection with said second region of said gate layer;
    an insulating layer located above said second region of said gate layer;
    an oxide layer located on sidewalls and bottom of said gate layer; and
    nitride spacers located along sidewalls of said second region of the gate layer but not along sidewalls of said first region of the gate layer, wherein said nitride spacers are in contact with said insulating layer, said barrier layer, and said oxide layer located on said sidewalls of said gate layer.

2. The self-aligned recessed gate structure of claim 1, wherein said gate layer comprises polysilicon material.

3. The self-aligned recessed gate structure of claim 1 wherein said conductive layer comprises a transition metal layer.

4. The self-aligned recessed gate structure of claim 1 wherein said insulating layer comprises a nitride cap material.

5. The self-aligned recessed gate structure of claim 1, wherein said conductive layer comprises a metal layer.

6. The self-aligned recessed gate structure of claim 1, wherein said conductive layer comprises a silicide.

7. A self-aligned recessed gate structure, comprising:
    a first recessed gate region having a first width, said first recessed gate region being located below a surface of a semiconductor substrate;
    a second gate region having a width of about 80 nm, said second gate region extending above said surface of said semiconductor substrate, wherein said second gate region comprises a gate layer, a conductive layer, and an insulating layer;
    an oxide layer located on sidewalls and bottom of each of said gate layer and said first recessed gate region; and
    insulating spacers located on sidewalls of said second gate region but not on said sidewalls of said first recessed gate region, wherein said insulating spacers are in contact with said insulating layer, said conductive layer and said oxide layer located on said sidewalls of said gate layer.

8. The self-aligned recessed gate structure of claim 7, wherein said first width is about 60 nm.

9. The self-aligned recessed gate structure of claim 7 wherein the conductive gate layer comprises a silicide.

10. The self-aligned recessed gate structure of claim 9, wherein said silicide is formed of a material selected from the group consisting of CoSi, TiSi, MoSi and NiSi.

11. The self-aligned recessed gate structure of claim 7, wherein said gate layer comprises a silicide and is formed of a material selected from the group consisting of CoSi, TiSi, MoSi and NiSi.

12. A memory cell, comprising:
    a silicon substrate;
    a transistor including a self-aligned recessed gate structure fabricated within said silicon substrate;
    a doped region in said silicon substrate disposed adjacent to said gate structure; and
    a capacitor formed over and electrically connected with said doped region,
    wherein said self-aligned recessed gate structure further comprises:
        a gate layer comprising:
            a first region having a first width located below a surface of said silicon substrate; and
            a second region having a second width greater than said first width, said second region extending above said surface of said silicon substrate;
        a conductive layer located above said second region of said gate layer;
        a barrier layer formed on the sidewalls and bottom of the conductive layer, the barrier layer separating said conductive layer from said second region of said gate layer;
        an insulating layer located above said conductive region; and
        an oxide layer located on the sidewalls and bottom said gate layer.

13. The memory cell of claim 12, wherein said second region extends above said surface of said silicon substrate by about 20 nm to about 800 nm.

14. The memory cell of claim 13, wherein said second region extends above said surface of said silicon substrate by about 200 nm.

15. The memory cell of claim 12, wherein said gate layer comprises a conductive material.

16. The memory cell of claim 15, wherein said conductive material is a silicide.

17. The memory cell of claim 16, wherein said silicide is formed of a material selected from the group consisting of CoSi, TiSi, MoSi and NiSi.

18. The memory cell of claim 16 wherein said insulating layer comprises a cap material over said silicide.

19. The memory cell of claim 18, wherein said cap material is formed of a nitride material or an etch-stop insulating material.

20. The memory cell of claim 12, wherein said memory cell is a DRAM memory cell.

21. The memory cell of claim 12, wherein said memory cell is part of a memory circuit coupled to a processor.

22. The memory cell of claim 21, wherein at least one of said processor and said memory circuit contains said gate structure.

* * * * *